United States Patent
Clements et al.

(10) Patent No.: US 7,187,206 B2
(45) Date of Patent: Mar. 6, 2007

(54) POWER SAVINGS IN SERIAL LINK TRANSMITTERS

(75) Inventors: Steven M. Clements, Durham, NC (US); Carrie E. Cox, Cary, NC (US); Hayden C. Cranford, Jr., Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 586 days.

(21) Appl. No.: 10/697,514

(22) Filed: Oct. 30, 2003

(65) Prior Publication Data

US 2005/0105507 A1    May 19, 2005

(51) Int. Cl.
*H03K 19/0175* (2006.01)
*H03H 11/26* (2006.01)

(52) U.S. Cl. ............................. 326/82; 326/29; 326/83; 326/86; 326/87; 327/52; 327/65; 327/156; 327/262

(58) Field of Classification Search .................. 326/29, 326/82–83, 86–87; 327/52, 65, 156, 262; 375/376
See application file for complete search history.

(56) References Cited

U.S. PATENT DOCUMENTS

| | | | |
|---|---|---|---|
| 3,898,573 A | 8/1975 | Sherman ...................... 328/167 |
| 5,020,078 A | 5/1991 | Crespo .......................... 375/12 |
| 5,285,116 A | 2/1994 | Thaik .......................... 307/443 |
| 5,452,466 A | 9/1995 | Fettweis ...................... 395/800 |
| 5,627,487 A * | 5/1997 | Keeth .......................... 327/112 |
| 5,650,736 A | 7/1997 | Pun et al. .................... 327/170 |
| 5,838,177 A * | 11/1998 | Keeth .......................... 327/108 |
| 5,862,390 A | 1/1999 | Ranjan .................. 395/750.01 |
| 6,084,907 A | 7/2000 | Nagano et al. ............. 375/230 |
| 6,114,844 A | 9/2000 | Chang et al. ............... 323/281 |
| 6,256,235 B1 * | 7/2001 | Lee ....................... 365/189.11 |
| 6,288,581 B1 | 9/2001 | Wong |
| 6,356,606 B1 | 3/2002 | Hahm ......................... 375/350 |
| 6,445,241 B2 | 9/2002 | Gabara ....................... 327/404 |
| 6,456,142 B1 | 9/2002 | Gilbert ....................... 327/356 |

(Continued)

FOREIGN PATENT DOCUMENTS

EP    0 503 888 A1    9/1992

(Continued)

*Primary Examiner*—Rexford Barnie
*Assistant Examiner*—Jason Crawford
(74) *Attorney, Agent, or Firm*—Sawyer Law Group LLP

(57) ABSTRACT

Aspects of saving power in a serial link transmitter are described. The aspects include providing a parallel arrangement of segments, each segment comprising prebuffer and output stage circuitry of the serial link transmitter and each segment enabled independently to achieve multiple power levels and multiple levels of pre-emphasis while maintaining a substantially constant propagation delay in a signal path of the serial link transmitter. Further aspects include providing a bypass path in the prebuffer stage circuitry to implement a controllable idle state in the segments and tail current and resistive load elements in the prebuffer circuitry as sectioned portions for slew rate control capability. Also included is provision of a control element with pre-emphasis delay circuitry in the transmitter signal path to allow inversion of a last delayed bit of the pre-emphasis delay circuitry to achieve a polarity change of a pre-emphasis weight.

21 Claims, 4 Drawing Sheets

U.S. PATENT DOCUMENTS

| | | | |
|---|---|---|---|
| 6,507,225 B2 | 1/2003 | Martin et al. | 327/108 |
| 6,597,233 B2 * | 7/2003 | Ray | 327/424 |
| 2002/0084870 A1 | 7/2002 | Cranford | 333/165 |
| 2002/0149402 A1 | 10/2002 | Martin et al. | |
| 2002/0153954 A1 | 10/2002 | Hochschild | 330/258 |
| 2002/0177266 A1 | 11/2002 | Klein et al. | |

FOREIGN PATENT DOCUMENTS

| | | |
|---|---|---|
| EP | 0 683 564 A1 | 11/1995 |
| JP | 6276316 | 4/1987 |

* cited by examiner

POWER SAVINGS IN SERIAL LINK TRANSMITTERS

FIELD OF THE INVENTION

The present invention relates to power savings in serial link transmitters.

BACKGROUND OF THE INVENTION

The ability to perform and achieve high speed transmissions of digital data has become expected in today's computing environment. In most cases, the transmission of digital data over longer distances is accomplished by sending the data in a high-speed serial format (i.e., one single bit after another) over a communication link designed to handle computer communications. In this fashion, data can be transferred from one computer system to another, even if the computer systems are geographically remote.

In order for high-speed serial transmission to occur, the digital data signal from inside the computer must be transformed from the parallel format into a serial format prior to transmission of the data over the serial communication link. This transformation is generally accomplished by processing the computer's internal data signal through a piece of computer equipment known as a serial link transmitter or "serializer." The function of the serializer is to receive a parallel data stream as input and, by manipulating the parallel data stream, output a serial form of the data capable of high-speed transmission over a suitable communication link. Once the serialized data has arrived at the desired destination, a piece of computer equipment known as a "deserializer" is employed to convert the incoming data from the serial format to a parallel format for use within the destination computer system.

For high speed serializer/deserializer (HSS) transmitters, the ability to adjust the transmitter amplitude is a desirable feature. In principle, the amount of current steered to the output of a differential transmitter need only be controlled to provide an adjustment to the transmitter amplitude. However, design of the transmitter must take into consideration a maximum current situation and size the transmitter devices accordingly to handle the maximum current case. Unfortunately, such a simple approach causes power to be wasted in lower amplitude situations.

Accordingly, a need exists for a serial link transmitter design that provides power savings while maintaining adjustability in transmitter amplitude. The present invention addresses such a need.

SUMMARY OF THE INVENTION

Aspects of saving power in a serial link transmitter are described. The aspects include providing a parallel arrangement of segments, each segment comprising prebuffer and output stage circuitry of the serial link transmitter and each segment enabled independently to achieve multiple power levels and multiple levels of pre-emphasis while maintaining a substantially constant propagation delay in a signal path of the serial link transmitter. Further aspects include providing a bypass path in the prebuffer stage circuitry to implement a controllable idle state in the segments and tail current and resistive load elements in the prebuffer circuitry as sectioned portions for slew rate control capability. Also included is provision of a control element with pre-emphasis delay circuitry in the transmitter signal path to allow inversion of a last delayed bit of the pre-emphasis delay circuitry to achieve a polarity change of a pre-emphasis weight.

The segmented prebuffer and output stage circuitry implementation of the present invention achieves a noise immune design with scalable power consumption. Further, amplitude levels of the transmitter are adjustable with uniform timing. These and other advantages will become readily apparent from the following detailed description and accompanying drawings.

DETAILED DESCRIPTION

The present invention relates to power savings in serial link transmitters. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

In accordance with the present invention, power savings for HSS designs is achieved with a segmented transmitter in which significant portions of the transmitter signal path (i.e., the pre-buffer and output stage) are split among parallel segments that are independently enabled. In this manner, multiple power levels and multiple levels of pre-emphasis are available, while maintaining a substantially constant propagation delay, as described in more detail in the following discussion of the figures.

Figure 1:
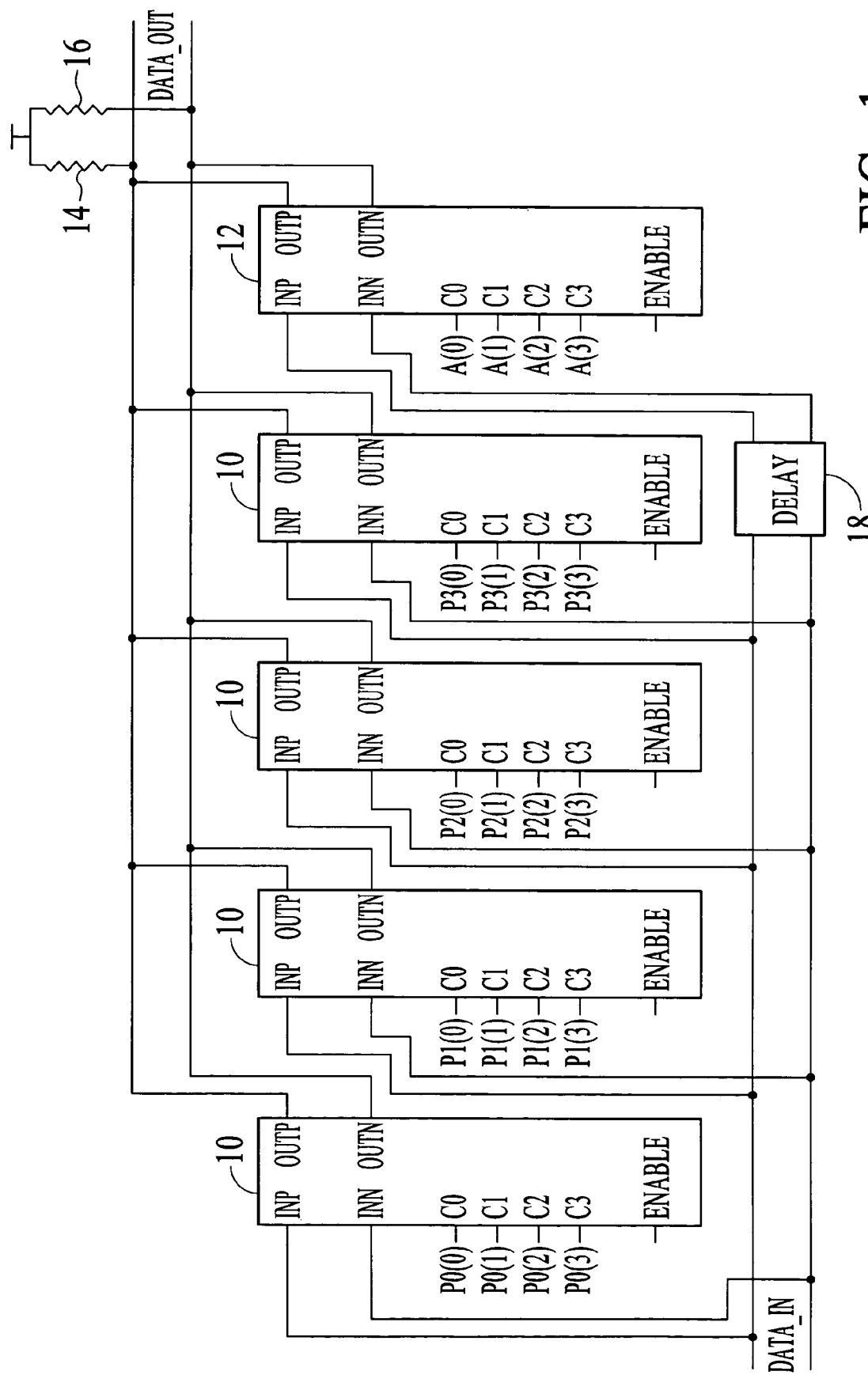
FIG. 1 illustrates a circuit diagram of an example embodiment of a segmented transmitter in accordance with the present invention.

Referring now to FIG. 1, a circuit diagram of an example embodiment of a segmented transmitter is presented. In the example illustrated, four different output power levels can be achieved with an adjustable amount of pre-emphasis. As shown in FIG. 1, a differential data input signal, DATA_IN, is transmitted via the segments 10 and 12 as a differential data output signal, DATA_OUT, whose amplitude is determined based upon the current transmitted on the output signal lines to the termination resistors 14 and 16. The DATA_IN signal is input directly to each of the segments 10 and is delayed via delay element 18 and inverted for input to the segment 12. Preferably, the segments 10 and 12 each comprise an equivalent circuit structure, as described in more detail with reference to FIG. 2. Further, while the example embodiment includes four (undelayed) segments 10 and one (delayed) segment 12 (i.e., a 4:1 ratio), this is meant as illustrative and not restrictive of the number of segments (or ratio) that can be included.

Figure 2:
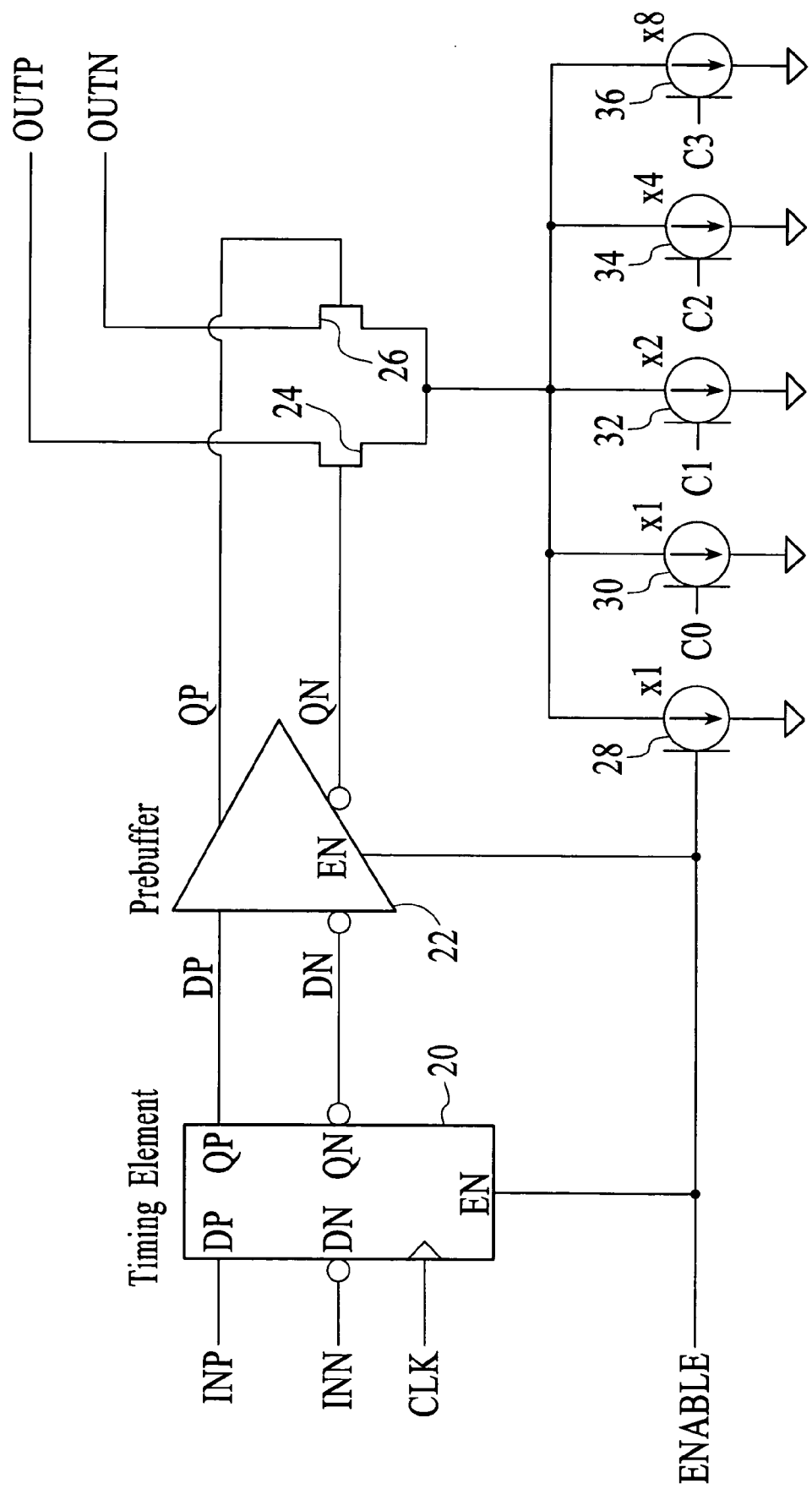
FIG. 2 illustrates a diagram of the circuit details of the segments of FIG. 1.

With reference now to FIG. 2, which illustrates a diagram of the circuit details of segments 10, 12, each segment includes a timing element 20 (e.g., a latch or multiplexer) coupled to a prebuffer 22, where each output (Q_N, Q_P) of the prebuffer 22 is coupled to a transistor 24, 26 from which the output signals OUT_N, OUT_P result. Coupled to transistors 24 and 26 are current sources 28, 30, 32, 34, and 36. The state of the ENABLE signal controls the enabling of the timing element 20, prebuffer 22, and current source 28 (which, for the example, provides one current unit, where one current unit represents e.g., 375 micro amps). The state of the control signals input to C0, C1, C2, and C3 controls the enabling of the current sources 30 (e.g., one current unit), 32 (e.g., two current units), 34 (e.g., four current units), and 36 (e.g., eight current units), respectively.

The control of the transmitter amplitude and the amount of pre-emphasis is adjustable by selectively enabling the segments 10 and 12 via ENABLE and current enable signals input to C0, C1, C2, and C3. By way of example, to achieve full power and maximum (50%) pre-emphasis, all current enable signals input to the delayed segment 12 would be in an enable state to provide one-fourth of the total current and all but one of current enable signals input to the undelayed segments 10 would be in an enable state (e.g., C2 would be in a disabled state for each segment 10) to provide ¾ of the total current. Whereas, to achieve full power and ⅛ pre-emphasis, one-half of the segment's current units would be enabled (e.g., C3 would be in a disabled state) for the delayed segment 12, while ⅞ of the current units would be enabled for the undelayed segments 10 (e.g., C1 would be in a disabled state). In this manner, the adjustability of the parallel segments achieves current steering that is balanced by the desired degree of pre-emphasis to maintain an overall constant peak amplitude among the segments.

Figure 3:
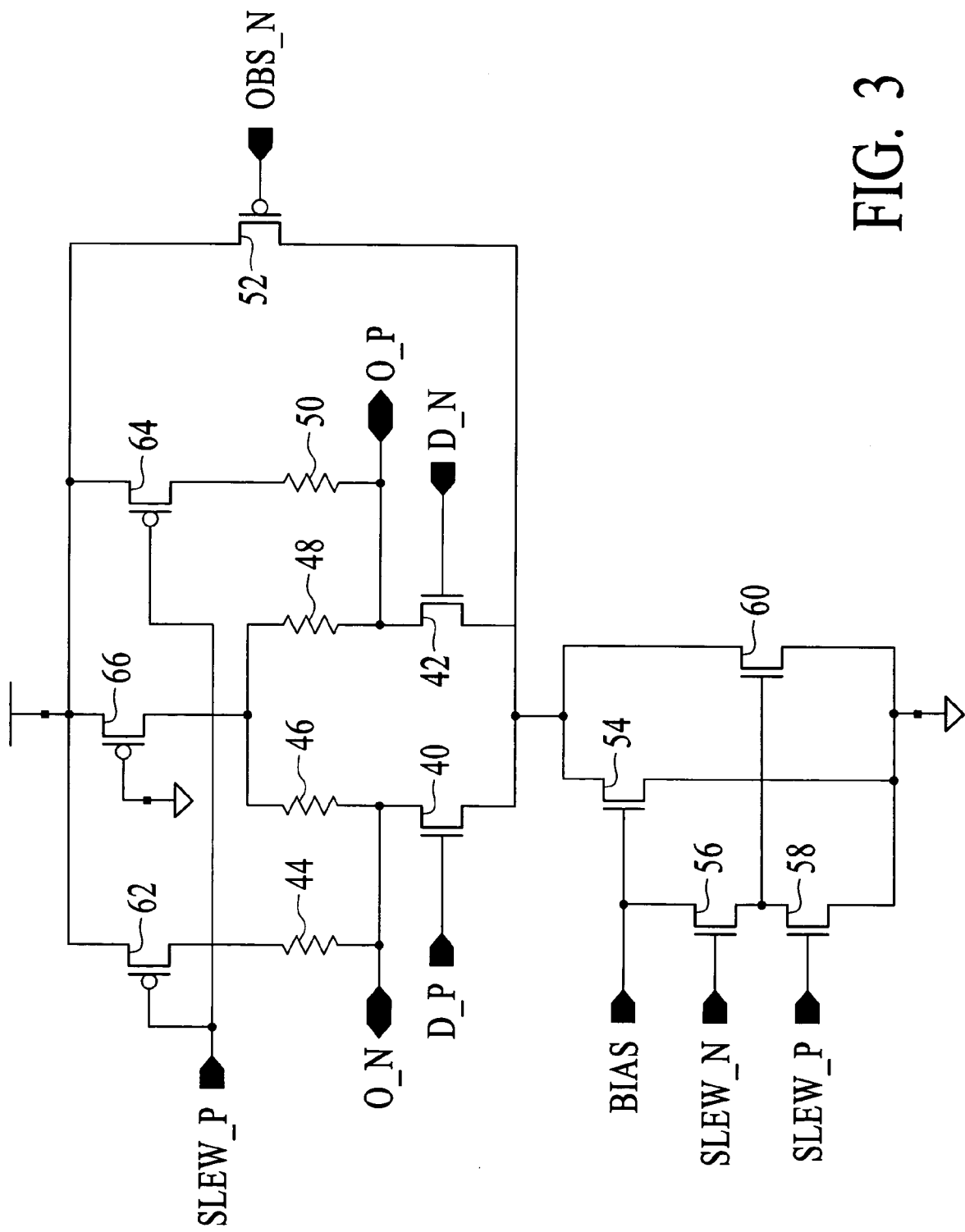
FIG. 3 illustrates a circuit diagram of the prebuffer of FIG. 2.

In a further aspect of the present invention, the prebuffer 22 accommodates both out-of-band signaling requirements and slew rate control, as presented with reference to the circuit diagram of the prebuffer 22 shown in FIG. 3. Within prebuffer 22, transistors 40 and 42 receive D_N and D_P input signals (from the timing element 20, FIG. 2) and are coupled to a resistive loading path, which includes resistors 44, 46, 48, and 50 from which the prebuffer 22 output signals Q_N and Q_P result. The prebuffer 22 further includes a bypass transistor 52 to accommodate out-of-band signaling/a controllable idle state. By activating the bypass transistor 52 (via control signal OBS_N), most of the tail current flows through it, so that no current flows through the resistive loading path or differential pair of transistors, and thus, the prebuffer 22 outputs Q_P and Q_N are both pulled HIGH. The differential output signal therefore drops to zero while the output common mode level is maintained to achieve the desired controllable idle state at the transmitter output. Inclusion of the bypass path transistor 52 thus effectively avoids the use of the slow and unstable approach of simply turning off the current to drop the differential output to zero.

For slew rate control needs, the prebuffer 22 also includes circuitry to achieve a slow output transition mode to accommodate half-rate operating modes. The prebuffer mode is implemented by including tail current sources 54 and 60 and control transistors 56 and 58, along with transistors 62 and 64 coupled to resistor elements 44 and 50, respectively, of the resistive loading path. In normal (fast) mode operation of the prebuffer, both tail current sections are 'ON' and both transistors 62 and 64 are 'ON' to connect the resistors 44 and 50 in parallel with resistors 46 and 48 via appropriate control signal levels for BIAS, SLEW_N and SLEW_P. (Transistor 66 is essentially always 'ON.') The resulting operation is identical to an unsectioned prebuffer. In slow mode, one-half of current source section is turned 'OFF' with one-half of the resistive load disconnected (resistor elements 44 and 50), i.e., by SLEW_P going HIGH. Because the capacitive load presented by the output stage of the segment (i.e., transistors 24, 26 and current sources 28, 30, 32, 34, and 36 of FIG. 2) is unchanged, the output transition times of the prebuffer are significantly increased under these conditions, i.e., the slew rate decreases as desired for half-rate operation.

Figure 4:
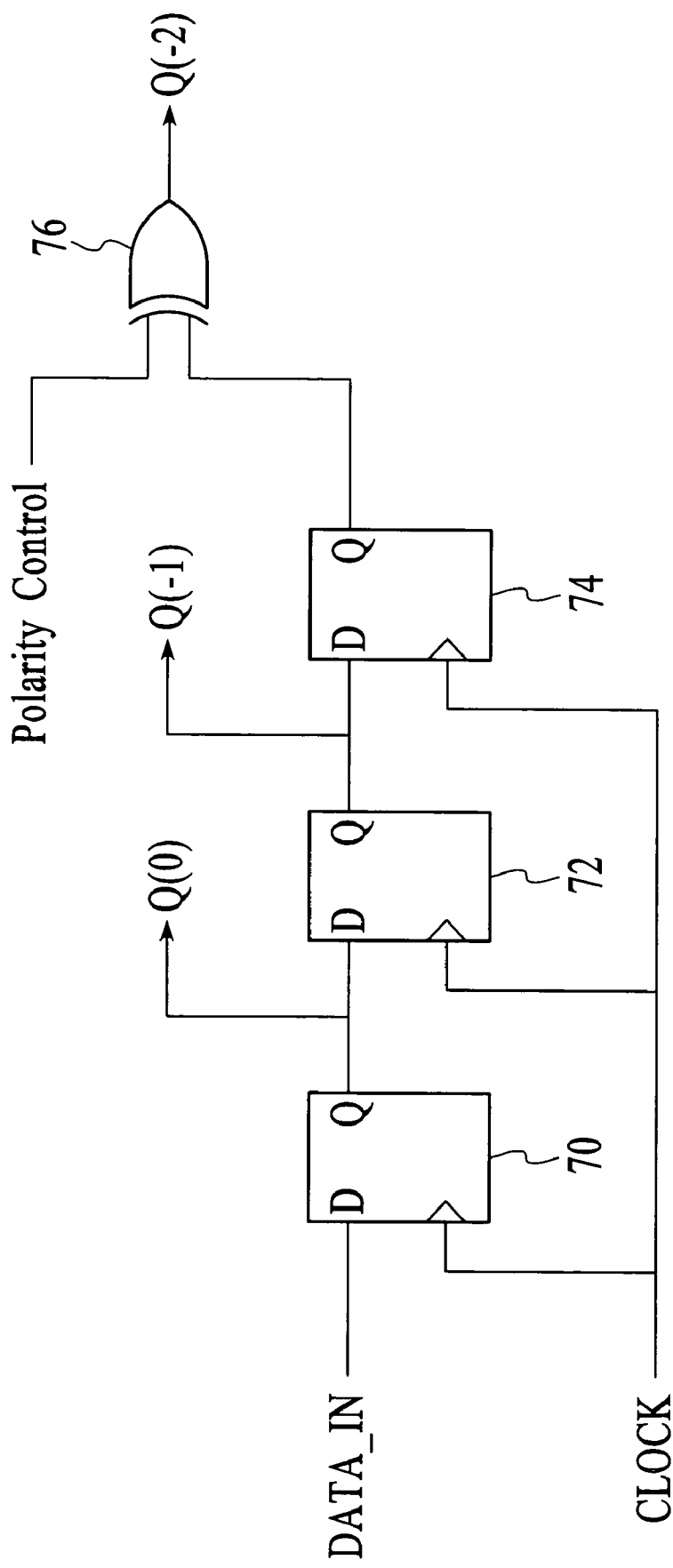
FIG. 4 illustrates a circuit diagram for pre-emphasis polarity control in accordance with the aspects of the present invention.

In addition to the slew rate control provided by the present invention, a further aspect includes pre-emphasis polarity control, as described with reference to the circuit diagram of FIG. 4. A pre-emphasis function is often implemented as a three-stage finite impulse response (FIR) digital filter in which the signal amplitude transmitted at each bit time is a weighted combination of the current and two previous data bits. While the weights for the two delayed data bits are normally negative, it has been found by the inventors of the present invention that a positive value for the second delayed weight is sometimes valuable for improving the pre-emphasis closer to optimal for a particular channel. Referring to FIG. 4, a delay element is represented as a shift register formed by a series of D flip-flops 70, 72, and 74, as is well understood in the art. (It should be appreciated that the series of flip-flops 70 and 72 could produce the delay-by-one output that is represented by the delay element 18 in FIG. 1). In order to adjust the polarity for the delay-by-two output of the circuit in FIG. 4, the present invention adds polarity control element, an exclusive-OR (XOR) gate 76, that receives the output from flip-flop 74 on one input and a polarity control signal on a second input. By controlling the level of the polarity control signal, the option exists to invert the value of the second delayed bit via the XOR gate 76, which is functionally equivalent to a polarity change of the pre-emphasis weight.

From the foregoing, it will be observed that numerous variations and modifications may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims.

What is claimed is:

1. A circuit comprising:
a parallel arrangement of segments, each segment comprising prebuffer and output stage circuitry and each segment enabled independently to achieve multiple power levels and multiple levels of pre-emphasis while maintaining a substantially constant propagation delay in a signal path of a serial link transmitter.

2. The circuit of claim 1 wherein a plurality of input signals selectively enable the parallel segments in order to balance desired amplitude and pre-emphasis needs in the transmitter signal path.

3. The circuit of claim 2 wherein the parallel segments further comprise undelayed and delayed segments to balance current steering with pre-emphasis levels in the transmitter signal path.

4. The circuit of claim 1 further comprising a bypass path in circuitry of the prebuffer stage circuitry to implement a controllable idle state in the segments.

5. The circuit of claim 4 wherein the bypass path further comprises a bypass transistor in the prebuffer stage circuitry.

6. The circuit of claim 1 further comprising tail current and resistive load elements in the prebuffer circuitry as sectioned portions for slew rate control capability.

7. The circuit of claim 1 further comprising a control element with pre-emphasis delay circuitry in the transmitter signal path to allow inversion of a last delayed bit of the pre-emphasis delay circuitry to achieve a polarity change of a pre-emphasis weight.

8. A method comprising: providing portions of a transmitter signal path as parallel segments; and independently enabling each of the parallel segments to control output signal amplitude, wherein the parallel segments further comprise undelayed and delayed segments to balance current steering with pre-emphasis levels in the transmitter signal path.

9. The method of claim 8 wherein the step of providing further comprises providing prebuffer and output stage circuitry as the parallel segments.

10. The method of claim 8 wherein the step of independently enabling each of the parallel segments further comprises utilizing a plurality of input signals for the parallel segments that selectively enable the parallel segments in order to balance desired amplitude and pre-emphasis needs in the transmitter signal path.

11. The method of claim 9 further comprising providing a bypass path in circuitry of the prebuffer stage circuitry to implement a controllable idle state in the segments.

12. The method of claim 9 further comprising providing tail current and resistive load elements in the prebuffer circuitry as sectioned portions for slew rate control capability.

13. The method of claim 8 further comprising providing a control element with pre-emphasis delay circuitry in the transmitter signal path to allow inversion of a last delayed bit of the pre-emphasis delay circuitry to achieve a polarity change of a pre-emphasis weight.

14. A system comprising:

a differential input signal; and a plurality of segments coupled in parallel for transmitting the differential input signal, wherein independent enabling of the plurality of segments provides multiple power levels and multiple levels of pre-emphasis while maintaining a substantially constant propagation delay in a signal path of the differential data signal.

15. The system of claim 14 wherein the plurality of segments further comprise a first number of segments receiving a differential data signal in an undelayed manner and a second number of segments receiving the differential data signal in a delayed manner.

16. The system of claim 14 wherein the plurality of segments each further comprise prebuffer circuitry and output stage circuitry.

17. The system of claim 16 wherein the prebuffer circuitry further comprises a bypass path to implement a controllable idle state in the segments.

18. The system of claim 17 wherein the bypass path further comprises a bypass transistor.

19. The system of claim 16 wherein the prebuffer stage circuitry further comprises tail current and resistive load elements as sectioned portions for slew rate control capability.

20. The system of claim 14 further comprising a control element with pre-emphasis delay circuitry in the signal path to allow inversion of a last delayed bit of the pre-emphasis delay circuitry.

21. A method comprising:

providing portions of a transmitter signal path as parallel segments; and independently enabling each of the parallel segments to control output signal amplitude, wherein the parallel segments further comprise undelayed and delayed segments to balance current steering with pre-emphasis levels in the transmitter signal path, further comprising providing a control element with pre-emphasis delay circuitry in the transmitter signal path to allow inversion of a last delayed bit of the pre-emphasis delay circuitry to achieve a polarity change of a pre-emphasis weight.

* * * * *